US006552934B2

United States Patent
Roohparvar

(10) Patent No.: US 6,552,934 B2
(45) Date of Patent: *Apr. 22, 2003

(54) APPARATUS AND METHOD FOR PROGRAMMING VOLTAGE PROTECTION IN A NON-VOLATILE MEMORY SYSTEM

(75) Inventor: Frankie F. Roohparvar, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/082,972

(22) Filed: Feb. 26, 2002

(65) Prior Publication Data

US 2002/0114189 A1 Aug. 22, 2002

Related U.S. Application Data

(62) Division of application No. 09/303,843, filed on May 3, 1999, now Pat. No. 6,392,928, which is a continuation of application No. 08/780,624, filed on Jan. 8, 1997, now Pat. No. 6,256,229.

(51) Int. Cl.[7] .............................................. G11C 16/04
(52) U.S. Cl. .................. 365/185.18; 365/226; 365/228; 365/189.07
(58) Field of Search ............................ 365/185.18, 226, 365/228, 189.07

(56) References Cited

U.S. PATENT DOCUMENTS

| 4,612,531 A | 9/1986 | Dingwall et al. ...... 340/347 AD |
| 5,003,192 A | 3/1991 | Beigel ........................ 307/140 |
| 5,109,257 A | 4/1992 | Kondo ....................... 357/23.5 |
| 5,177,705 A | 1/1993 | McElroy et al. ............ 365/185 |
| 5,199,032 A | 3/1993 | Sparks et al. .................. 371/3 |
| 5,274,827 A | 12/1993 | Haggerty et al. ........... 395/750 |
| 5,663,918 A | 9/1997 | Javanifard et al. .......... 365/226 |
| 5,864,569 A | 1/1999 | Roohparvar ............. 371/40.18 |
| 5,943,263 A | 8/1999 | Roohparvar ........... 365/185.18 |

FOREIGN PATENT DOCUMENTS

| DE | 4226710 | 6/1996 |
| WO | 97/48100 | 12/1997 |

OTHER PUBLICATIONS

"2–MBIT Smart Voltage Boot Block Family", *Intel Data Book*, exceprt, 3–157, 3–190 and 3–1.

Yoo, S., et al., "Variable Vcc Design Techniques for Battery–Operated DRAM's", *IEICE Transactions on Electronics*, No. 5, Tokyo, Japan, pp. 839–843, (May 1993).

*Primary Examiner*—Richard Elms
*Assistant Examiner*—Toan Le
(74) *Attorney, Agent, or Firm*—Schwegman, Lundberg, Woessner & Kluth, P.A.

(57) ABSTRACT

A memory system including an array of memory cells, a programming voltage node for receiving a first programming voltage, a memory controller which controls memory programming operations on the array of memory cells, and voltage detection circuitry, operably coupled to the memory controller and the programming voltage node, with the voltage detection circuitry being configured to enable the memory controller to initiate one of the programming operations if the first programming voltage exceeds a first voltage level and to continue the programming operation once the programming operation has been initiated if the first programming voltage drops to a second voltage level and to terminate the programming operation once the programming operation has been initiated if the first programming voltage drops below the second voltage level, with the first voltage level being greater than the second voltage level.

27 Claims, 5 Drawing Sheets

APPARATUS AND METHOD FOR PROGRAMMING VOLTAGE PROTECTION IN A NON-VOLATILE MEMORY SYSTEM

RELATED APPLICATIONS

This application is a Divisional of U.S. Ser. No. 09/303,843 filed on May 3, 1999, now U.S. Pat. No. 6,392,928, which is a Continuation of U.S. Ser. No. 08/780,624 filed on Jan. 8, 1997, now issued as U.S. Pat. No. 6,256,229 on Aug. 24, 1999, which are incorporated herein by reference.

TECHNICAL FIELD

The present invention relates generally to memory systems that utilize an externally supplied programming voltage.

BACKGROUND OF THE INVENTION

Integrated circuit memory systems require some form of externally supplied voltage to carry out various memory operations, including memory read, program and erase operations. Typically, voltages of various magnitudes are required to carry out these operations. Memory systems generally utilize a primary power source having significant current capabilities. The primary power source is typically provided to the memory by an external source such as a power supply or battery. The primary power source, frequently referred to as $V_{cc}$, is connected to the memory system by way of metal circuit pads formed on the integrated circuit itself. The primary supply voltage $V_{cc}$ typically has been set to +5 volts, although there has been a trend to reduce the voltage to +3.3 volts and even lower.

Memory systems also typically utilize voltages other than the primary supply voltage $V_{cc}$ for carrying out memory operations. By way of example, memory program operations for flash memory systems typically require application of a relatively large positive voltage to a selected one of the word lines of the flash cell array in order to carry out a programming operation. Such voltage, typically on the order of +12 volts, is sometimes referred to as voltage $V_{pp}$. At the same time, a voltage $V_{PPBL}$ of intermediate value, typically on the order of +7 volts, is applied to a selected one of the bit lines of the flash cell array as part of the programming operation. In most applications, the bit line program voltage is derived from voltage $V_{pp}$ using an on-chip voltage regulator.

A typical conventional memory system may have a separate metal circuit pad for receiving the programming voltage $V_{pp}$ from an external source along with the pad for receiving voltage $V_{cc}$. In the event single power supply operation is desired, a charge pump circuit can be implemented on the chip so that the externally supplied voltage $V_{cc}$ can be stepped up to voltage $V_{pp}$.

As an example of a memory system utilizing a programming voltage $V_{pp}$ from an external source, the function of a conventional non-volatile flash memory system is shown in the block diagram of FIG. 1. The core of memory system 1 is an array 12 of memory cells. The individual cells in array 12 (not shown) are arranged in rows and columns, with there being, in this example, a total of 256K eight bit words in array 12. Data input and output for the memory system 1 is accomplished by using an eight bit data bus DQ0–DQ7. The individual memory cells are accessed by using an eighteen bit address A0–A17, which is input by means of address pins 13. Nine of the eighteen address bits are used by X decoder 14 to select a word line associated with the row of array 12 in which a desired memory cell is located and the remaining nine bits are used by Y decoder 16 to select a bit line associated with the appropriate column of array 12 in which the desired cell is located. Sense amplifiers 50 are used to read the data contained in a memory cell during a read operation or during a data verification step in which the state of a cell is determined after a write or erase operation. The sense amplifier circuitry and verify circuits compare the state of the cell to a reference state corresponding to a programmed cell or an erased cell, depending upon the operation.

Writing or erasing of the memory cells in array 12 is carried out by applying the appropriate voltages to the source (source line), drain (bit line), and control gate (word line) of a cell for an appropriate time period. This causes electrons to tunnel or be injected from a channel region to a floating gate. The amount of charge residing on the floating gate determines the voltage required on the control gate in order to cause the device to conduct current between the source and drain regions. This is termed the threshold voltage of the cell with there being an erased threshold voltage $V_{THE}$ that is different from a programmed threshold voltage $V_{THP}$. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

Memory system 1 contains an internal state machine (ISM) 20 which controls the data processing operations and sub-operations performed on the memory cells contained in memory array 12. These include the steps necessary for carrying out writing, reading and erasing operations on the memory cells of array 12. In addition, internal state machine 20 controls operations such as reading or clearing status register 26, identifying memory system 1 in response to an identification command, and suspending an erase operation. State machine 20 functions to reduce the overhead required of an external processor (not depicted) typically used in association with memory system 1.

To avoid inadvertent programming of the memory device, programming commands (write or erase) consist of two cycles. The first cycle is a setup command wherein the code corresponding to the programming operation is written to the memory chip. To perform the setup command, the external processor causes the output enable pin $\overline{OE}$ to be inactive (high), and the chip enable $\overline{CE}$ and write enable $\overline{WE}$ pins to be active (low). The, processor then places the 8 bit setup command code on data I/O pins 15 (DQ0–DQ7) and causes the chip enable $\overline{CE}$ and write enable $\overline{WE}$ pins to go inactive.

The command code for the first cycle of a write operation (write setup) is, for example, either 40H (1000 0000) or 10H (0001 0000). In the second cycle of a write sequence, after the chip enable $\overline{CE}$ and write enable $\overline{WE}$ pins are made inactive (high), the data to be written is placed on the data I/O pins 15 and the address of the memory location to be programmed is placed on the address pins 13 (A0–A17). The chip enable $\overline{CE}$ and write enable $\overline{WE}$ are again made active (low) while the programming voltage $V_{pp}$ is applied to a selected one of the word lines of memory device 1 by way of the X decoder 14. In addition, $V_{PPL}$ is applied to the selected bit lines by Y decoder 16. The rising edge of the chip enable $\overline{CE}$ and write enable $\overline{WE}$, whichever is later in time, causes the physical write operation on the memory cell to be initiated by application of the programming voltages to the cell. Similarly, for an erase operation, the first cycle involves sending an erase setup command code such as 20H (0010 0000) to the memory device 1. The second cycle of an erase, however, involves an erase confirm command code such as D0H (1101 0000) that is written to the memory device and the rising edge of chip enable $\overline{CE}$ and write enable $\overline{WE}$ initiates the erase cycle which erases either the entire memory array 12 or a block of memory locations within the array depending upon the functionality designed into the device.

The commands placed on data I/O pins 15 are transferred to data input buffer 22 and then to command execution logic unit 24. Command execution logic unit 24 receives and interprets the commands used to instruct state machine 20 to initiate and control the steps required for writing to array 12 or carrying out another desired operation. When a write operation is being executed, the data to be programmed into the memory cells is then input using data I/O pins 15, transferred to input buffer 22, and then placed in input data latch 30. The input data in latch 30 is then made available for the cell programming and data verification operations.

In the cell programming operation, an internal program pulse counter (not depicted) is initialized. This counter will keep track of the number of programming pulses that have been applied to the cells of the word (byte) being programmed. Next, a programming pulse is applied to the cells of the word located at the address placed on the address pins 13. The pulse counter is then incremented and a determination is made as to whether a predetermined maximum number of pulses have been applied to the cells. The cells are then checked, during a verify cycle, to determine whether they have, in fact, been programmed. If the cells are programmed, then the operation has executed successfully. If the cells are not programmed and the maximum number of pulses has not yet been reached, then another programming pulse is applied to the cells. Checking the programming state of the cells is accomplished using the sense amplifiers and associated components 50.

If the cells are still not programmed when the maximum pulse count is reached, then a failure has occurred because the maximum number of programming pulses have been applied to the cells. Depending upon the design of the particular memory, the sequence will be terminated or a record of the failed word will be made and the sequence continued. This information will then be transferred to the Status Register 26 80 that it can be read by the processor. Once the desired write or erase operation sequence is completed, state machine 20 updates 8 bit status register 26. The content of the status register 26, in a typical memory device, indicates whether a successful write or erase sequence has been completed. The contents of status register 26 is transferred to data output buffer 28, which makes the contents available on data I/O pins 15 of memory system 1.

Typically, the programming voltage levels described above are permitted to vary by 10% from the specified level and the memory device will still operate correctly. However, if the voltage level falls outside the specified ranges, then the programming function may fail and corrupt the data stored in the memory cells or a successful programming operation would require an unacceptably long period of time. Also, the out-of-specification voltage levels are an indication of failure in the system to which the memory device is connected.

Conventional memory systems are typically only able to detect whether $V_{pp}$ drops below a preset voltage level such as +10V during the programming operation. If $V_{pp}$ drops below the predetermined limit, then a voltage sense circuit will sense that an invalid voltage condition exists. At the beginning of a programming operation, or at any point at which the ISM 20 receives an indication that $V_{pp}$ is below the predetermined limit, the ISM 20 will abort the operation and set one or more status bits in the status register 26.

One common status bit in the status register 26 is a programming voltage error flag which indicates whether $V_{pp}$ was outside the specified limit during the operation. If $V_{pp}$ was outside the specified range, then the memory device may have aborted the operation, even if $V_{pp}$ dipped out of range only momentarily. If, during the verify cycle after a programming pulse has been applied, the ISM 20 detects that the programming voltage was out of the specified range, then it will halt the programming operation and set the programming voltage error flag. However, the programming state of the cells will already have been altered to some degree by the programming pulse.

Once a programming or erase operation has been completed, a user can access the status register 26 to determine the status of various parameters during the operation, including the status of $V_{pp}$. If an erase operation was unsuccessful, the cause of the problem, such as low voltage levels, must be eliminated and the procedure repeated. However, if a write operation has been unsuccessful, it is very possible that the data in the memory system has been corrupted and recovery may not be possible. In some non-volatile memory systems, an unsuccessful write attempt may require that at least a portion of the memory array must be erased before another write operation may be performed at the same location in the array.

In addition, $V_{pp}$ voltage levels also typically sag as a result of the current drawn by the memory system to perform the programming operation. As a result, the voltage level of $V_{pp}$ may be above the predetermined limit prior to the initiation of the programming operation, but then drop below the limit as a consequence of the programming operation itself.

A memory system having the capability of monitoring the programming voltages and preventing programming operations from being initiated that are likely to be unsuccessful or to avoid aborting memory operations that have been initiated and will likely complete successfully would be very desirable. The present invention provides this and other capabilities as will become apparent to those skilled in the art upon a reading of the following Detailed Description of Specific Embodiments together with the drawings.

SUMMARY OF THE INVENTION

The present invention is directed to an apparatus and method for detecting whether the level of a programming voltage $V_{pp}$ for a memory device is within one of several acceptable voltage ranges and preventing the execution of a programming operation if the programming voltage is not within an acceptable voltage range.

In the method of the present invention, when a programming operation, such as a write or an erase, is initiated, the programming voltage is sampled. If the voltage is found to be outside of a predetermined acceptable voltage range, then the programming operation is blocked from proceeding.

In the present inventive circuit, when a programming operation is initiated, an internal control device causes the programming voltage applied to a connection pad of the memory device to be sampled by a voltage detection circuit. The detection circuit determines whether or not the sampled voltage is within one of several predetermined ranges that will guarantee that programming will be successful and generates a corresponding logic signal before the programming voltage is applied to the memory cells of the memory device. If the voltage level is out of range, the internal control device will block the programming operation from proceeding in order to prevent the data in the memory from being corrupted and will activate an error indication to communicate that the operation was terminated due to inadequate programming voltage.

After the programming operation begins, the voltage detection circuit applies a different set of acceptable voltage ranges to the programming voltage that permits the memory device to continue the programming operation even if the programming voltage falls outside of the initial range of acceptable voltage levels.

Further objects and advantages of the present invention will become apparent from the following detailed description and accompanying drawings.

DETAILED DESCRIPTION OF SPECIFIC EMBODIMENTS

Figure 1:
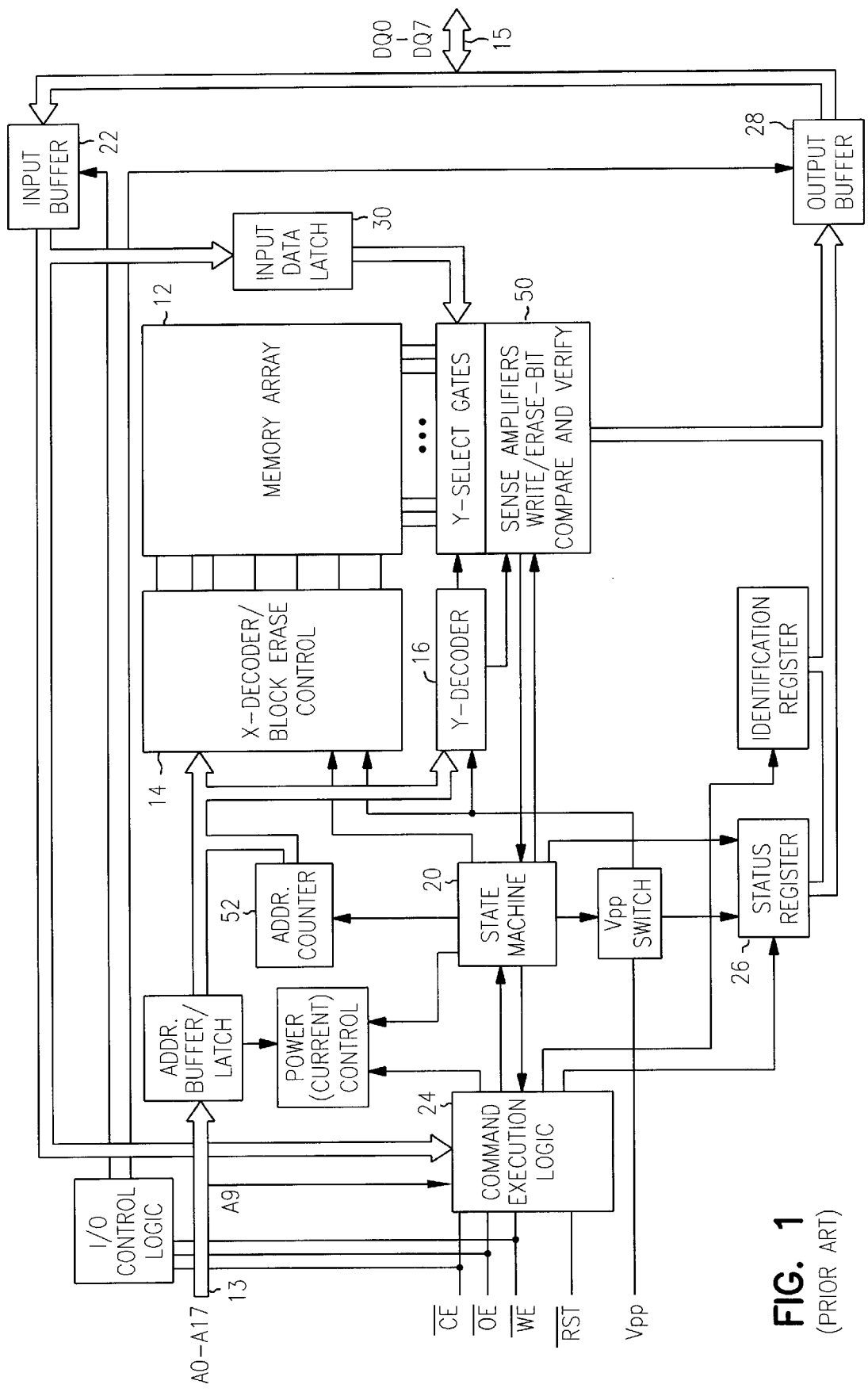
FIG. 1 is a functional block diagram of a conventional flash memory system.
Figure 2:
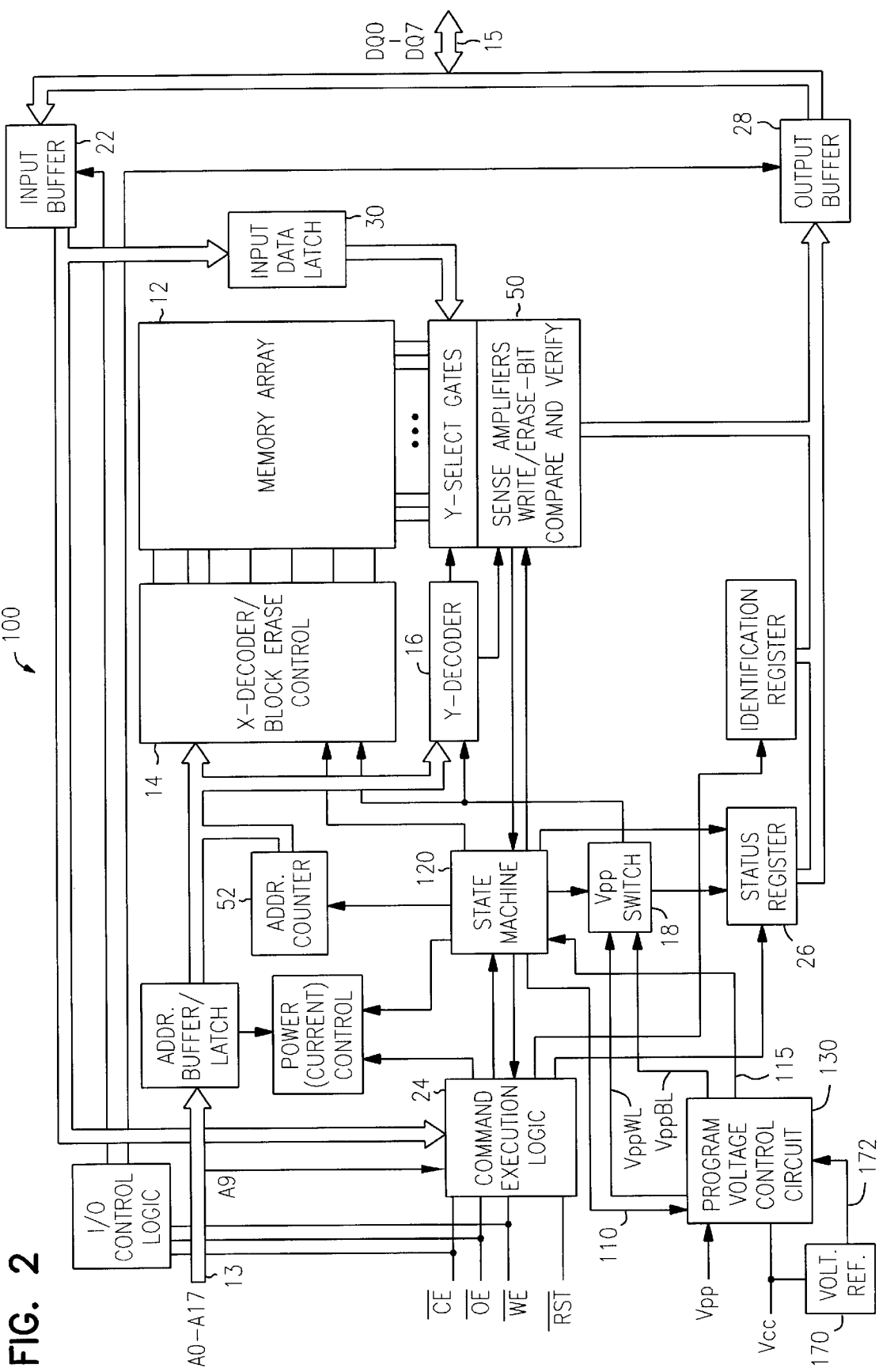
FIG. 2 is a functional block diagram of a flash memory system embodying the present invention.

FIG. 2 is a block diagram of the components of a flash memory system in accordance with the present invention which monitors the programming voltage level $V_{pp}$ and produces a signal indicating whether the voltage signal is within a range that guarantees that programming will be successful. It is noted that similar reference numbers in FIGS. 1 and 2 refer to the same signals and components in the two figures. Although the invention will be described with reference to a flash memory system, it is important to recognize that the present invention can be implemented as part of other types of memory systems.

As with the memory system of FIG. 1, the core of memory system 100 is an array 12 of flash memory cells. The individual memory cells (not shown) are accessed by using an eighteen bit address A0–A17, which is input by means of address pins 13. Memory system 100 contains internal state machine (ISM) 120 which controls the data processing operations and sub-operations performed on memory system 100, such as the steps necessary for carrying out writing, reading and erasing operations on the memory cells of array 12. Internal state machine 120 is typically implemented in the form of a set of logic gates whose inputs determine which operations and sub-operations of the memory system are carried out and in what order those operations occur.

Memory system commands are placed on data I/O pins 15, and are transferred to data input buffer 22 and then to command execution logic unit 24. Command execution logic unit 24 receives and interprets the commands which are used to instruct state machine 120 to perform the steps required for writing or erasing array 12 or carrying out another desired operation. Once an operation is completed, state machine 120 updates 8 bit status register 26. The contents of status register 26 is transferred to data output buffer 28, which makes the contents available on data I/O pins 15 of memory system 100.

As will be explained in greater detail, a program voltage control circuit 130 is provided which monitors the magnitude of the programming voltage $V_{pp}$ at the initiation of a programming operation. In the event the voltage is outside of a predetermined acceptable initial voltage range or set of several acceptable initial voltage ranges, the circuit functions to interrupt the programming operation before any memory data can be corrupted.

During execution of the programming operation, the program voltage control circuit 130 continues to monitor $V_{pp}$ but applies a different predetermined acceptable execution voltage range or set of several acceptable execution voltage ranges such that the ISM 120 will permit execution to continue so long as $V_{pp}$ is within an acceptable execution range even though $V_{pp}$ may be outside of any of the acceptable initial voltage ranges.

In a typical conventional memory system, there is a specified minimum set-up time period between the point at which voltage $V_{pp}$ must be within an acceptable initial range and the point at which the memory cells start to become physically programmed while meeting the operation specifications for the memory system. The programming cycle is typically initiated at the rising edge of the $\overline{WE}$ signal. An exemplary minimum set-up time period is 100 nanoseconds (see the device specification for the MT28F002 256K×8 Flash Memory, "Flash Memory Data Book", Micron Quantum Devices, Inc., 1994). The program voltage control circuit 130 of the present invention must sense the programming voltage $V_{pp}$ within the set-up time and abort the programming sequence if the $V_{pp}$ is not within a predetermined voltage range, as will be explained.

The program voltage control circuit 130 is connected to the programming power supply pad and receives timing signals 110 from state machine 120 and returns a voltage level signal 115 to state machine 120. In the course of the set-up and execution of a programming operation, the ISM 120 will generate timing signals 110 that will cause the program voltage control circuit 130 to sample the programming voltage level $V_{pp}$ present at the programming power supply pad. Voltage reference 170 provides a reference voltage level 172 that program voltage control circuit 130 uses for comparison purposes.

The program voltage control circuit 130 will subsequently generate a voltage level OK (LevelOK) signal 115 that the ISM 120 will check before proceeding to execute the programming operation. If the voltage level signal 115 indicates that the programming voltage is not within an acceptable initial voltage range, then the ISM 120 will block the write operation and an error indication will be set in the 8 bit status register 26. If the voltage level signal 115 indicates that the programming voltage is within an acceptable initial voltage range, then ISM 120 proceeds to perform the programming operation.

The program voltage control circuit also supplies the word line programming voltage $V_{PPW1}$ and bit line programming voltage $V_{PPBL}$ to the $V_{pp}$ switch 18 which further relays these voltages to the X decoder 14 and Y decoder 16, respectively, for application to the cells of memory array 12.

Figure 3:
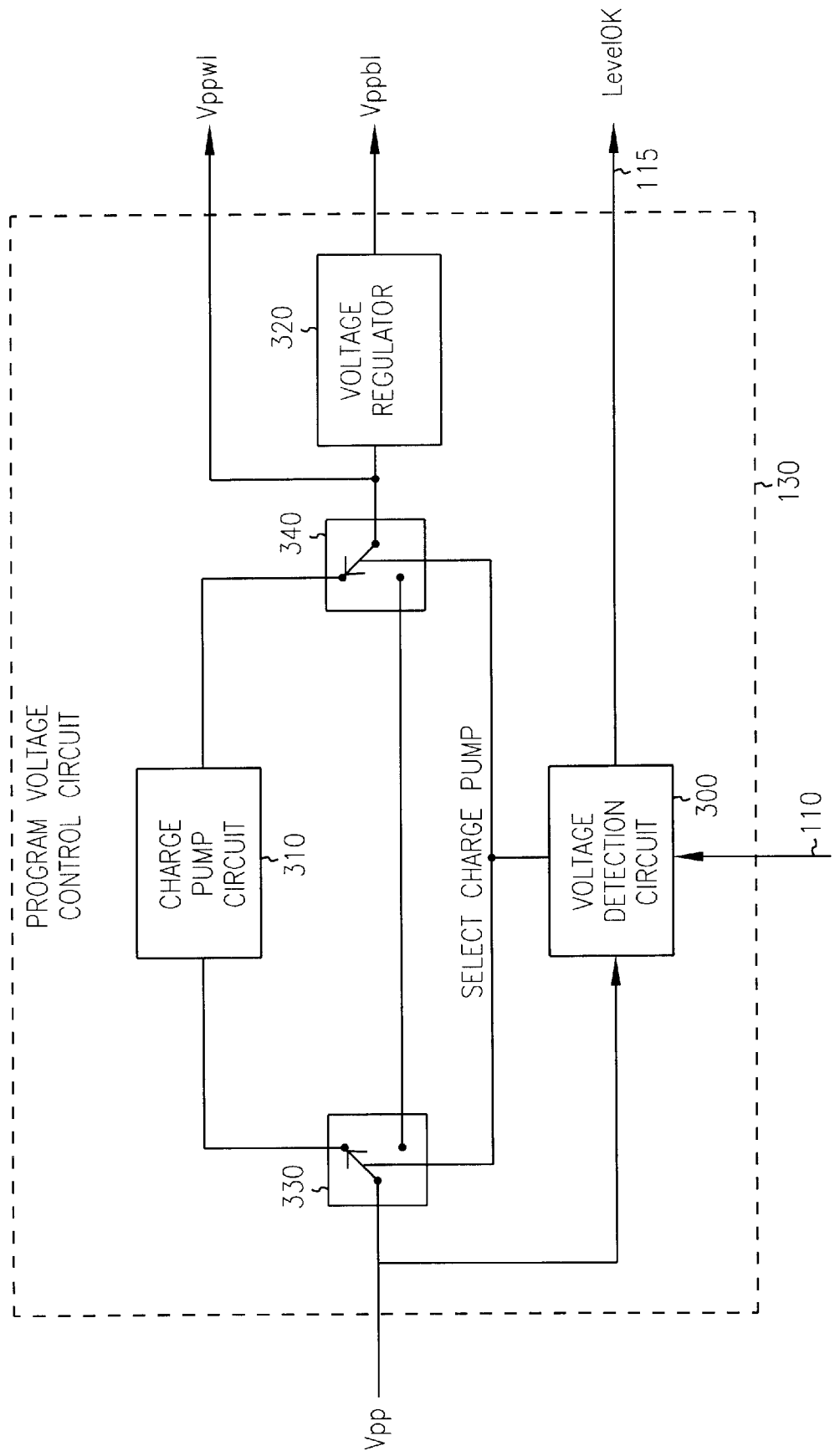
FIG. 3 is a functional block diagram illustrating an embodiment of the program voltage control circuit of the present invention.

FIG. 3 is a block diagram of the program voltage control circuit 130. The program voltage control circuit 130 is connected to the externally supplied programming voltage $V_{pp}$ which is received by voltage detection circuit 300. The voltage detection circuit 300 also receives control signal 110 from state machine 120 which cause it to sample the voltage level of $V_{pp}$ in preparation for a write operation. The voltage detection circuit 300 generates and provides LevelOK signal 115 to state machine 120 which indicates whether $V_{pp}$ is within an acceptable voltage range. Voltage detection circuit 300 further generates a SELECT CHARGE PUMP signal which, when the voltage level of $V_{pp}$ is insufficient to directly program memory cells, but is within a voltage range sufficient to permit charge pump circuit 310 to produce an appropriate programming voltage level. As will be explained, Select Charge Pump signal is active only when voltage $V_{pp}$ has a magnitude of less than +6 volts and more than +3 volts. When active, the Select Charge Pump signal will cause switch 330 to connect the input of charge pump circuit 310 to $V_{pp}$ while simultaneously causing switch 340 to connect the $V_{ppbl}$ input of voltage regulator 320 to the output of charge pump circuit 310. The output of voltage regulator 320 then uses the voltage level output from charge pump circuit 310 (+12 volts, for example) to generate the appropriate voltage level for $V_{ppbl}$ (+7 voltage, for example).

Conversely, when the voltage level of $V_{pp}$ is high enough to directly supply the programming voltage levels (over +10 volts, for example), then voltage detection circuit 300 causes switch 330 to disconnect charge pump circuit 310 from $V_{pp}$ and directly couples $V_{pp}$ to $V_{ppbl}$ through switches 330 and 340 to the input of voltage regulator 320. $V_{pp}$ is then used to directly provide $V_{ppwl}$ and drive voltage regulator 320 to produce $V_{PPBL}$. In some applications, it may be desirable to provide a further voltage regulator (not depicted) for generating voltage $V_{ppwl}$ In that event the regulator would have an input connected to the output of switch 340 as is regulator 320 50 that voltage $V_{ppwl}$ is regulated in the same manner as is voltage $V_{ppbl}$ This will ensure that $V_{ppwl}$ does not exceed a maximum specification value in the event input $V_{pp}$ becomes too large. Note that any such regulator used to produce $V_{pwl}$ will cause a drop in voltage so that it may be necessary to provide another charge pump circuit between the regulator and switch 340. Since voltage $V_{ppwl}$ is connected to the word lines which draw little current, the current requirements of such an additional charge pump circuit will be small.

In the event voltage $V_{pp}$ is less than +10 volts, the voltage cannot be used to directly program the memory, so that a charge pump circuit, such as circuit 310 must be used. However, if the voltage is greater than +6 volts, the voltage still cannot be used since a voltage of this magnitude is likely to damage the CMOS circuitry typically used to implement charge pump circuit$_{310}$. The damage typically is caused when the CMOS inverters of the pump 310 enter a snap back mode of operation when switching from one state to another. Thus, it is necessary to ensure that no voltage greater than +6 volts is applied to charge pump circuit$_{310}$ by making the Select Charge Pump signal inactive when $V_{pp}$ is greater than +6 volts.

Figure 4:
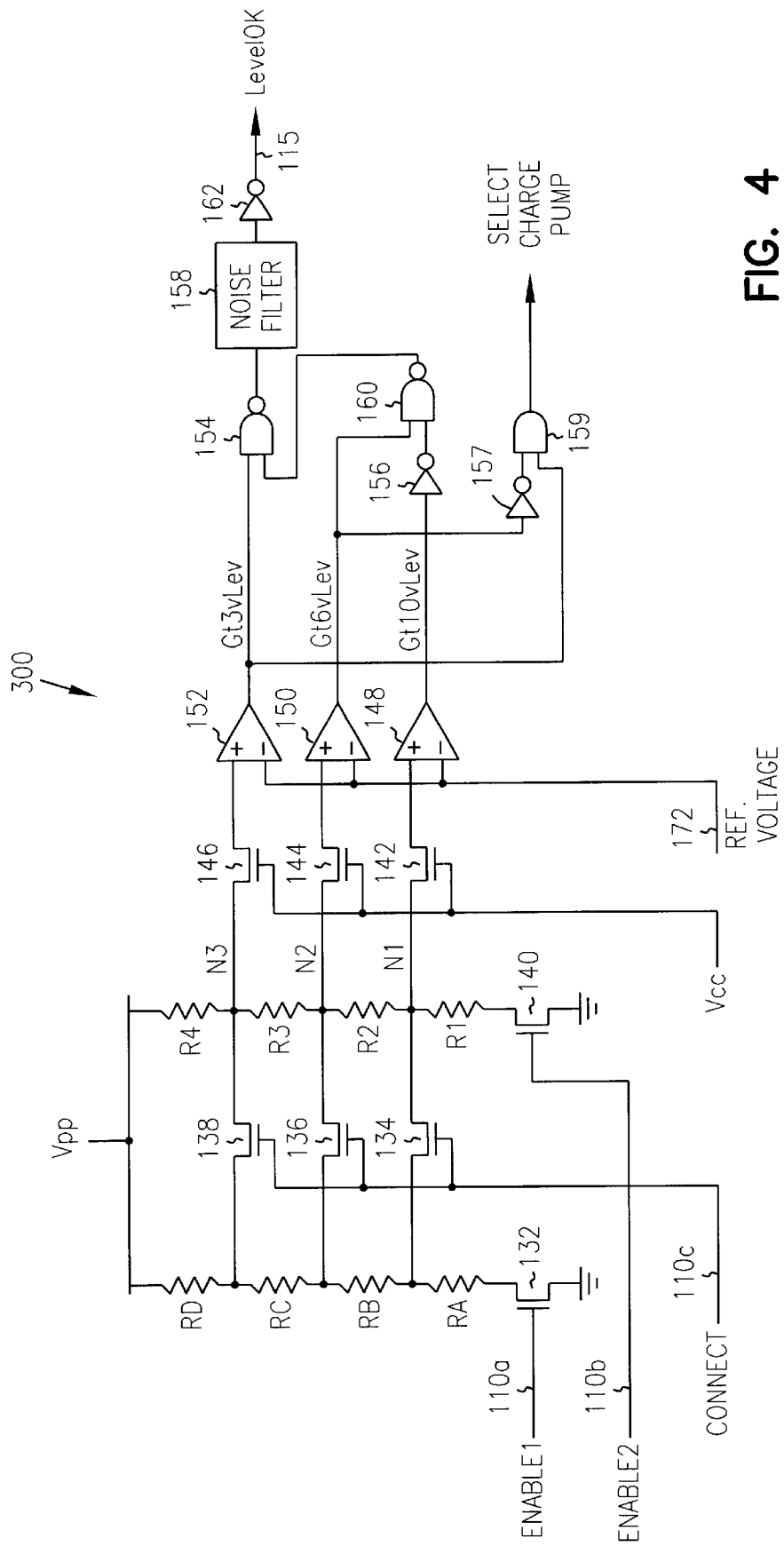
FIG. 4 is a diagram illustrating a voltage detection circuit of an embodiment of the present invention that monitors the programming voltage level $V_{pp}$ and produces a signal indicating whether the voltage is sufficient to program a memory array.

An embodiment of voltage detection circuit 300 of the present invention is shown in FIG. 4. The components of timing signals I 10 supplied by ISM 120 are shown as Enable1 110a, Enable2 110b and Connect 110c.

The voltage detection circuit 300 utilizes a dual resistance ladder to sample the programming voltage. The low resistance leg includes resistors RA, RB, RC and RD which have low resistance values in series with transistor 132 that permits current to flow from programming voltage $V_{pp}$ pad to ground when the Enable1 signal 110a is active. The low resistance values permit rapid initialization of a series of voltage sampling nodes N1, N2, and N3 which are each connected through transistors 142, 144 and 146 respectively to the inputs of voltage comparators 148, 150 and 152 respectively.

Transistors 134, 136 and.138 connect the low resistance leg to sampling nodes N1, N2 and N3 respectively and are controlled by Connect signal 110c which, when inactive, isolates the low resistance leg from the nodes. The higher current of the low resistance leg rapidly charges the sample nodes N1–3 to permit the programming voltage to be quickly sampled. By inactivating Connect signal 110c and enable signal 110a, the relatively high current in the low resistance leg can be shut-off once voltage sampling nodes N1–3 are charged.

The resistors RA, RB, RC and RD may also be selected to have relative ratios that result in a set of acceptable initial voltage ranges that produce an active LevelOK signal 115 while Enable1 110a and Connect 110c are active that are different from a set of acceptable execution voltages that apply when only Enable2 110b is active.

The high resistance leg of the resistance ladder consists of high magnitude resistors R1, R2, R3 and R4 connected in series with transistor 140 controlled by the Enable2 signal 110b. The points at which the resistors of the high resistance leg meet are the voltage sampling nodes N1–3. The greater resistance of the high resistance leg results in a relatively low current draw. Consequently, the voltage at the sample nodes N1–3 can be maintained at a lower current level by leaving Enable2 110b active after Enable1 110a and Connect 110c have been deactivated.

Some sample resistance values for resistors RA, RB, RC and RD in an embodiment of the present invention are 6 kΩ, 4 kΩ, 10 kΩ and 10 kΩ respectively. The corresponding values for resistors R1, R2, R3 and R4 are 60 kΩ, 40 kΩ, 100 kΩ and 100 kΩ, respectively. These values are approximations based upon n-well resistors and will vary depending upon the semiconductor technology used and the details of the design of the specific memory system. What is notable here is that the resistance values of R1, R2, R3 and R4 are an order of magnitude greater than the resistance values of RA, RB, RC and RD in order to obtain a lower current draw through the high resistance leg.

The ratios of the given resistor values may also be adjusted between the two legs in order to obtain an active LevelOK signal 115 for different voltage ranges of $V_{pp}$ when both Enable1 110a and Enable2 110b are active and when only Enable2 110b is active. When only Enable2 110b is active, then the voltage ranges that produce an active LevelOK signal 115 are determined by the relative ratios of R1, R2, R3 and R4 because the low voltage leg resistors RA, RB, RC and RD are isolated from the sample nodes N1, N2 and N3. Therefore, a different set of acceptable execution voltage ranges can be defined with the appropriate selection of resistance values for R1, R2, R3 and R4.

Transistors 142, 144 and 146 protect the comparators 148, 150 and 152 from overvoltage conditions that may occur at nodes N1, N2 and N3. The gates of the transistors are connected to the operational supply voltage $V_{cc}$. The reference voltage 172 is typically around 2 Volts. As long as the voltage $V_{cc}$ at the gates of transistors 142, 144 and 146 is high enough to transfer 2 Volts from the drain to the source of each transistor, the logic of the comparators 148, 150 and 152 will function properly. However, if any of the voltages at nodes N1, N2 and N3 rises above the supply voltage level, then the voltage at the input to the comparators will be limited to the supply voltage level less the threshold voltage of the transistor. Since Enable1 110*a* and Enable2 110*b* are inactive during non-programming operations, nodes N1–3 will be pulled up toward the voltage at $V_{pp}$. $V_{pp}$ could be at 12V or higher during non-programming modes, as well as during programming operations This means that nodes N1–3 could be at high voltage levels for extended periods of time. Transistors 142, 144 and 146 thus act as voltage limiters that protect comparators 148, 150 and 152 from long-term high gate or oxide voltage exposure damage.

The Select Charge Pump signal is generated by combining the signal Gt3vLev with the inverse of signal GtLev using inverter$_{157}$ together with AND gate$_{159}$. Thus, as previously noted, the Select Charge Pump signal is active only when voltage $V_{pp}$ is less than +6 volts and more than +3 volts.

Figure 5:
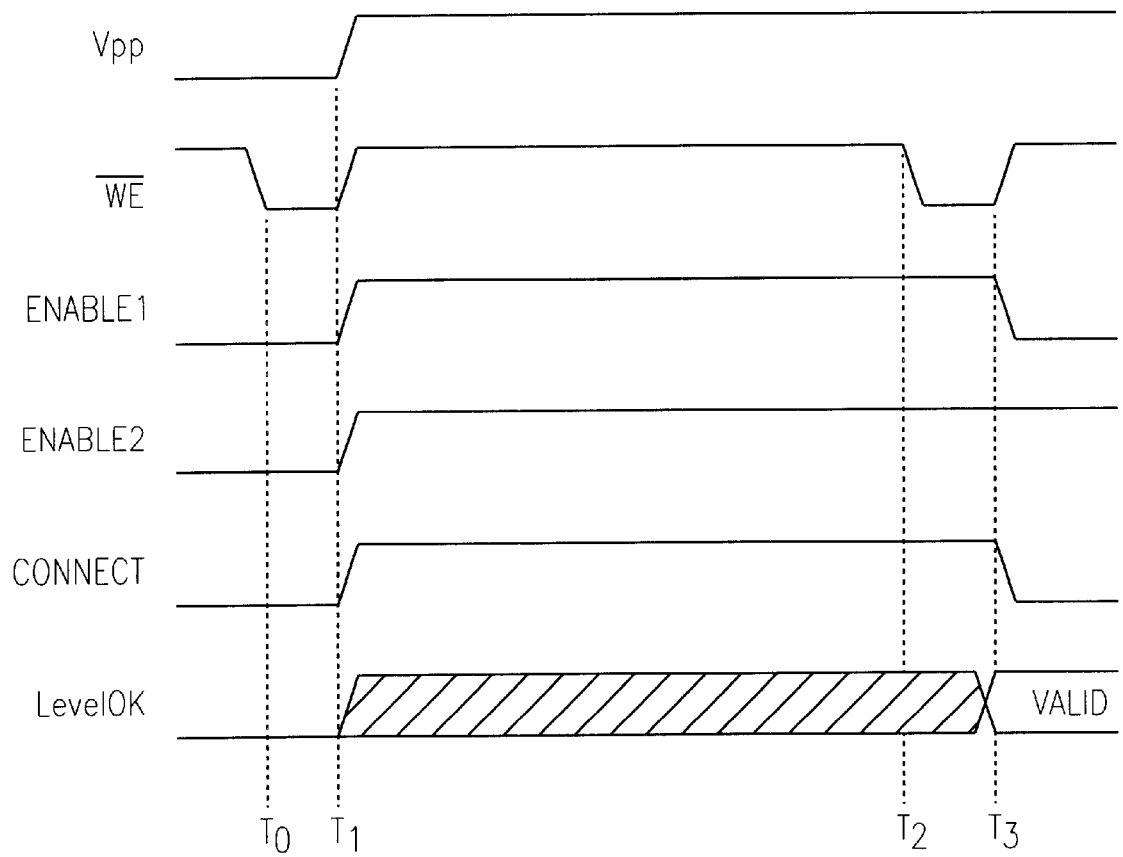
FIG. 5 is a timing diagram illustrating an example of the signals input to and output from the voltage detection circuit of FIG. 4.

The timing diagram in FIG. 5 illustrates an example of a timing scheme for the present invention and will be used to further describe the function of the circuit in FIG. 4.

First, a write or erase setup command is written to the memory device 100 during a write pulse occurring on $\overline{WE}$ between time to and time t1 in FIG. 5. In response to the rising edge of the write enable $\overline{WE}$ signal at time t1, ISM 120 will activate Enable1 110*a*, Enable2 110*b* and Connect 110*c*. This permits current to flow from the $V_{pp}$ pad through both legs of the resistance ladder and rapidly charge the capacitances of sampling nodes N1 N2 and N3 during the period from t1 to t2. The voltages present at the nodes N1–3 may result in logic level changes in the LevelOK output 115 of the voltage detection circuit 300. However, LevelOK 115 will not be sampled by ISM 120 until later in the write/erase sequence.

As discussed above, there is a set-up time during which $V_{pp}$ must be within a predetermined voltage range specified for the memory device 100, such as between +3 and +6V or over +10V. A common device specification for the set-up time is 100 nanoseconds. This corresponds to 100 nanoseconds before t3. At t3, the Enable1 110*a* and Connect 110*c* signals go inactive thereby isolating the low resistance leg (RA, RB, RC and RD) from the high resistance leg (R1, R2, R3 and R4). However, Enable2 110*b* remains active and current from the $V_{pp}$ pad continues to flow in the high resistance leg to maintain the voltage samples at nodes N1–3.

Enable1 100*a* and Connect 110*c* will remain active until t3. Since R1–R4 have much higher impedances than RA–RD, the ratio of the resistors of RA–RD primarily determines the logic value of the LevelOK 115 signal upon initiation of programming at t3. By t3, the LevelOK 115 signal must be at a valid logic value reflecting the conditions at the $V_{pp}$ pad and the ISM 120 will either proceed with the programming operation or block programming and issue an error indication based on the value of LevelOK 115. Table 1 shows an example of the relationship between $V_{pp}$ and the logical value of LevelOK 115. (The entries in Table 1 with "- - -" in the LevelOK column indicate voltage conditions which are not possible e.g. the entry in the second row where $V_{pp}$ is greater than +10V and thus cannot also be less than +3V and +6V.)

TABLE 1

| >+3 VOLTS | >+6 VOLTS | >+10 VOLTS | LEVEL OK |
|---|---|---|---|
| 0 | 0 | 0 | N |
| 0 | 0 | 1 | — |
| 0 | 1 | 0 | — |
| 0 | 1 | 1 | — |
| 1 | 0 | 0 | Y |
| 1 | 0 | 1 | — |
| 1 | 1 | 0 | N |
| 1 | 1 | 1 | Y |

Beginning at t1, the voltage, at node N1 is connected through transistor 142 to the positive input of comparator 148. The voltage at N1 is compared to the reference voltage 172 supplied to the negative terminal of comparator 148 from voltage reference 170. The reference voltage 172 and the resistance values for RA–D and R1–4 are selected such that, when $V_{pp}$ is above a predetermined voltage level (+10V in this example), then the output of comparator 148 goes high and the logic signal GtiQvLev will propagate through inverter 156 and NAND gate 160 to the input of NAND gate 154. If $V_{pp}$ is above +10V then the output of comparator 152 will also be high thus forcing the output of NAND gate 154 low. Transient signal changes appearing at the outputs of comparators 148, 150 and 152 that are caused by voltage spikes in $V_{pp}$ are prevented from being propagated through inverter 162 and into the LevelOK signal 115 by the noise filter 158. In addition, resistors R1–4 can be fabricated to have capacitance, such as when the resistors are fabricated as n-well semiconductor devices. The large area required to achieve high resistance results in high capacitance. Because of the large resistance and capacitance of the devices, a filter with a large RC constant is created which also tends to filter out transient noise in the voltage at $V_{pp}$.

In a manner similar to the events at N1, the voltage at N2 passes through transistor 144 to the input of comparator 150 to produce Gt6vLev. For this example, the reference voltage 172 and the resistance values for RA–D and R1–4 are selected such that when $V_{pp}$ is above +6V, then Gt6vLev will be high. If the voltage is less than +10V, then Gt10vLev will be low resulting in the output of NAND gate 160 being forced low. This low value will propagate to the LevelOK 115 output which will be forced low. The low logic level on LevelOK indicates that the voltage at $V_{pp}$ is too low to be used directly to program the cells in memory array 12 and too high to use a charge-pump to generate the programming voltage for the cells. The ISM 120, when it observes the low logic output from LevelOK 115, will prohibit the programming operation from proceeding and a $V_{pp}$ failure bit will be set in the status register.

Likewise, the voltage at N3 passes through transistor 146 to the positive input of comparator 152 for sampling. As with nodes N1 and N2 above, the reference voltage 172 and resistance values RA–D and R1–4 are selected such that Gt3vLev will be high when $V_{pp}$, is above +3V. When Gt3vLev is low, the voltage at $V_{pp}$ is too low to either provide a programming voltage level or supply sufficient voltage to permit a charge pump to generate a programming voltage level and LevelOK 115 will be forced low to signal the ISM 120 to block further execution of the programming operation. If Gt3vLev is high but Gt6vLev is low, indicating that the voltage is greater than +3V but less than +6V so that a charge pump can operate, then both inputs to NAND gate 154 will be high which will result in LevelOK 115 being high thus signaling the ISM 120 that $V_{pp}$ is at least sufficient to operate the charge pump and the ISM 120 will proceed with the programming operation.

Figure 6:
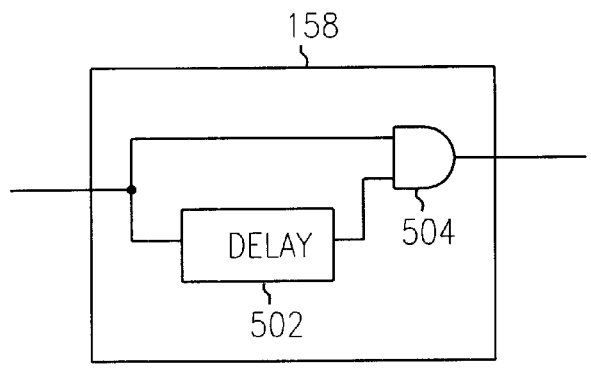
FIG. 6 is a diagram illustrating an embodiment of a noise filter.

An example of an embodiment of the noise filter 158 is shown in FIG. 6. The output of NAND gate 154 is split into two signals, one which feeds directly into an input of AND gate 504 and the other which is input to delay circuit 502. When a valid voltage condition exists, the output of NAND gate 154 will be low causing the output of AND gate 504 to also be low. If a transient condition in $V_{pp}$ causes the output of NAND gate 154 to become high, then the output of delay 502 will remain low for a predetermined delay time and thus force the output of AND 504 to also be low. If the output of NAND gate 502 returns to a low value before the high signal is propagated to the output of delay 502, then the output of AND 504 will not reflect the change in signal from NAND gate 154.

In addition as discussed above, because the low resistance leg is isolated from the high resistance leg by transistors 134, 136, and 138 controlled by the Connect signal 110c, the values of RA, RB, RC and RD can be selected to be proportionately different from one another than R1, R2, R3 and R4. By selecting different relative proportions for the two legs, the acceptable initial voltage ranges can be made different from the acceptable execution voltage ranges. In other words, the resistors can be chosen such that different voltage ranges result in LevelOK 115 going active for an initial sampling through the low resistance leg than for the high resistance leg. In this manner, the programming voltage can be subject to higher requirements at the beginning of the programming operation in order to prevent a programming operation from being initiated which will fail but also compensate for the voltage sags that will occur in $V_{pp}$ due to the current drawn when the programming pulses are applied. After execution has commenced, the memory cells have already been altered and it is desirable to attempt to continue the operation in case it is able to complete successfully.

Once the programming operation has commenced at t3, it may be undesirable to abort the operation and produce an error indication in response to a momentary sag in $V_{pp}$ if the fluctuation is minor and therefore unlikely to result in failure of the write or erase operation on the memory array 12. Also, the programming operation may be able to complete successfully by simply applying a larger number of programming pulses to the cells. Because only Enable2 11b is active after t3, the ratio of resistors R1–R4 determines the range of voltages that produce an active LevelOK 115 signal. R1–R4 may therefore be selected to obtain a different range of acceptable voltages during the time period after t3 in which execution of the programming operation takes place. By placing more stringent restrictions on the range of acceptable voltages at the initiation of a programming operation, t3 in the present example, than during execution of the operation, programming operations can be carried out despite the presence of transitory fluctuations in the programming voltage.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A memory system, comprising:
    an array of memory cells;
    a programming voltage node for receiving a first programming voltage;
    a memory controller which controls programming operations on the array of memory cells; and
    voltage detection circuitry operably coupled to the memory controller and to the programming voltage node, the voltage detection circuitry configured to enable the memory controller to initiate a selected one of the programming operations if the first programming voltage is within a first voltage range having an upper voltage level and a lower voltage level, and to continue the selected one of the programming operations if the first programming voltage drops below the lower voltage level but remains above a second voltage level which is lower than the lower voltage level.

2. The memory system of claim 1, wherein the voltage detection circuitry is further configured to enable the memory controller to initiate the selected one of the programming operations if the first programming voltage is above a third voltage level, wherein the third voltage level is below the upper voltage level.

3. The memory system of claim 1, wherein the voltage detection circuitry is further configured to enable the memory controller to initiate the selected one of the programming operations if the first programming voltage is above a third voltage level, wherein the third voltage level is below the lower voltage level.

4. The memory system of claim 3, wherein the voltage detection circuitry is further configured to prevent the memory controller from initiating the selected one of the programming operations when the first programming voltage exceeds a fifth voltage level which is less than the lower voltage level.

5. The memory system of claim 3, wherein the voltage detection circuitry is further configured to prevent the memory controller from initiating the selected one of the programming operations when the first programming voltage exceeds a fifth voltage level which is less than the lower voltage level and less than the third voltage level.

6. A memory system, comprising:
    an array of memory cells;
    a programming voltage node for receiving a first programming voltage;
    a memory controller which controls programming operations on the array of memory cells; and
    voltage detection circuitry including a charge pump circuit, wherein the voltage detection circuitry is operably coupled to the memory controller and to the programming voltage node, the voltage detection circuitry being configured to enable the memory controller to initiate a selected one of the programming operations if the first programming voltage is within a first voltage range having an upper voltage level and a lower voltage level, and to continue the selected one of the programming operations if the first programming voltage drops below the lower voltage level but remains above a second voltage level which is lower than the lower voltage level.

7. The memory system of claim 6, wherein the voltage detection circuitry is further configured to continue the selected one of the programming operations through the charge pump circuit if the first programming voltage drops below the lower voltage level but remains above a third voltage level lower than the lower voltage level.

8. The memory system of claim 6, wherein the voltage detection circuitry is further configured to prevent the memory controller from initiating the selected one of the programming operations when the first programming voltage exceeds a fifth voltage level which is less than the lower voltage level.

9. The memory system of claim 6, wherein the array of memory cells is included in an integrated circuit and the programming voltage node comprises a metal pad of the integrated circuit which receives the first programming voltage from a source external to the integrated circuit.

10. A memory system, comprising:
an array of memory cells;
a programming voltage node for receiving a first programming voltage;
a memory controller which controls programming operations on the array of memory cells; and
voltage detection circuitry including a charge pump circuit, wherein the voltage detection circuitry is operably coupled to the memory controller and to the programming voltage node, the voltage detection circuitry configured to enable the memory controller to initiate a selected one of the programming operations if a first voltage is within a first voltage range having an upper voltage level and a lower voltage level, and to continue the selected one of the programming operations if the first programming voltage drops below the lower voltage level but remains above a second voltage level which is lower than the lower voltage level, and wherein the voltage detection circuitry is further configured to enable the memory controller to initiate the selected one of the programming operations if the first voltage magnitude is above a third voltage level, wherein the third voltage level is below the lower voltage level.

11. The memory system of claim 10, wherein the voltage detection circuitry is further configured to continue the selected one of the programming operations through the charge pump circuit if the first programming voltage drops below the lower voltage level but remains above the third voltage level.

12. The memory system of claim 10, wherein the memory cells are non-volatile memory cells.

13. A memory system, comprising:
an array of memory cells;
a programming voltage node for receiving a first programming voltage;
a memory controller which controls programming operations on the array of memory cells;
voltage detection circuitry operably coupled to the memory controller and to the programming voltage node, the voltage detection circuitry configured to enable the memory controller to initiate a selected one of the programming operations if a first voltage is within a first voltage range having an upper voltage level and a lower voltage level, and to continue the selected one of the programming operations if the first programming voltage drops below the lower voltage level but remains above a second voltage level which is lower than the lower voltage level, and wherein the voltage detection circuitry is further configured to enable the memory controller to initiate the selected one of the programming operations if the first voltage magnitude is above a third voltage level, wherein the third voltage level is below the lower voltage level; and
a charge pump circuit operably connectable between the voltage detection circuitry and the memory controller, wherein the voltage detection circuitry is further configured to route the first programming voltage through the charge pump circuit when the first programming voltage is between the third voltage level and a fifth voltage level which is lower than the upper voltage level.

14. The memory system of claim 13, wherein the voltage detection circuitry is configured to continue the selected one of the programming operations through the charge pump circuit if the first programming voltage remains greater than a lowest voltage level, wherein the lowest voltage level is below the lower voltage level, and wherein the voltage detection circuitry is configured to terminate the selected one of the programming operations through the charge pump circuit if the first programming voltage drops below the lowest voltage level.

15. The memory system of claim 13, wherein the array of memory cells is included in an integrated circuit and the programming voltage node comprises a metal pad of the integrated circuit which receives the first programming voltage from a source external to the integrated circuit.

16. A memory system, comprising:
an array of memory cells;
a programming voltage node for receiving a first programming voltage;
a memory controller which controls programming operations on the array of memory cells;
voltage detection circuitry operably coupled to the memory controller and to the programming voltage node, the voltage detection circuitry configured to enable the memory controller to initiate a selected one of the programming operations if a first voltage magnitude is within a first voltage range having an upper voltage level and a lower voltage level, and to continue the selected one of the programming operations if the first programming voltage drops below the lower voltage level but remains above a second voltage level which is lower than the lower voltage level, and wherein the voltage detection circuitry is further configured to enable the memory controller to initiate the selected one of the programming operations if the first voltage is above a third voltage level, wherein the third voltage level is below the lower voltage level; and
a charge pump circuit operably connectable between the voltage detection circuitry and the memory controller, wherein the voltage detection circuitry is further configured to route the first programming voltage through the charge pump circuit when the first programming voltage is between the third voltage level and a fifth voltage level which is lower than the lower voltage level.

17. The memory system of claim 16, wherein the voltage detection circuitry is configured to continue the selected one of the programming operations through the charge pump circuit if the first programming voltage remains greater than a lowest voltage level, wherein the lowest voltage level is below the lower voltage level, and wherein the voltage detection circuitry is configured to terminate the selected one of the programming operations through the charge pump circuit if the first programming voltage magnitude drops below the lowest voltage level.

18. The memory system of claim 16, wherein the memory cells are non-volatile memory cells.

19. A memory system, comprising:
an array of memory cells;
a programming voltage node for receiving a first programming voltage;
a memory controller which controls programming operations on the array of memory cells; and
a voltage divider circuit operably coupled to the programming voltage node and the memory controller, the voltage divider circuit switchable between a first state in which the voltage divider circuit produces at least one signal to initiate a selected one of the programming operations if the first programming voltage is within a first voltage range having an upper voltage level and a lower voltage level, and a second state in which the voltage divider circuit produces at least one signal to continue the selected one of the programming operations if the first programming voltage drops below the lower voltage level but remains above a second voltage level which is lower than the lower voltage level.

20. The memory system of claim 19, wherein the voltage divider circuit is further configured to initiate the selected one of the programming operations if the first programming voltage is above a third voltage level, wherein the third voltage level is below the upper voltage level.

21. The memory system of claim 19, wherein the voltage divider circuit is further configured to initiate the selected one of the programming operations if the first programming voltage is above a third voltage level, wherein the third voltage level is below the lower voltage level.

22. The memory system of claim 21, wherein the voltage divider circuit is further configured to prevent initiation of the selected one of the programming operations when the first programming voltage exceeds a fifth voltage level which is less than the lower voltage level.

23. The memory system of claim 21, wherein the voltage divider circuit is further configured to prevent initiation of the selected one of the programming operations when the first programming voltage exceeds a fifth voltage level which is less than the lower voltage level and less than the third voltage level.

24. The memory system of claim 19, wherein the voltage divider circuit includes a first and a second voltage divider, and wherein the first voltage divider is configured to provide a first signal indicative of a first portion of the first programming voltage at a first node, and wherein the second voltage divider is configured to provide a second signal indicative of a second portion of the first programming voltage at a junction.

25. A memory system, comprising:
an array of memory cells;
a programming voltage node for receiving a first programming voltage;
a memory controller which controls programming operations on the array of memory cells; and
a voltage divider circuit including a first voltage divider having a first and a second impedance coupled in series to form a first node therebetween, the voltage divider circuit operably coupled to the programming voltage node and the memory controller, the voltage divider circuit switchable between a first state in which the voltage divider circuit produces at least one signal to initiate a selected one of the programming operations if the first programming voltage is within a first voltage range having an upper voltage level and a lower voltage level, and a second state in which the voltage divider circuit produces at least one signal to continue the selected one of the programming operations if the first programming voltage drops below the lower voltage level but remains above a second voltage level which is lower than the lower voltage level.

26. The memory system of claim 25, wherein the voltage divider circuit further comprises a second voltage divider having a third and a fourth impedance coupled in series to form a junction therebetween.

27. The memory system of claim 26, wherein the first and second voltage dividers each has a series impedance, and wherein the series impedance of the first voltage divider is substantially higher than the series impedance of the second voltage divider.

* * * * *